(12) United States Patent
Nemati et al.

(10) Patent No.: US 6,653,175 B1
(45) Date of Patent: Nov. 25, 2003

(54) STABILITY IN THYRISTOR-BASED MEMORY DEVICE

(75) Inventors: Farid Nemati, Menlo Park, CA (US); Hyun-Jin Cho, Palo Alto, CA (US); Scott Robins, San Jose, CA (US)

(73) Assignee: T-Ram, Inc., Mountain View, CA (US)

( * ) Notice: Subject to any disclaimer, the term of this patent is extended or adjusted under 35 U.S.C. 154(b) by 0 days.

(21) Appl. No.: 10/231,805

(22) Filed: Aug. 28, 2002

Related U.S. Application Data

(62) Division of application No. 09/814,980, filed on Mar. 22, 2001, now Pat. No. 6,462,359.

(51) Int. Cl.$^7$ ............................................. H01L 21/332
(52) U.S. Cl. ..................... 438/133; 257/109; 257/137; 257/335; 257/750; 365/96
(58) Field of Search ............................... 257/137, 109, 257/335, 750; 365/96

(56) References Cited

U.S. PATENT DOCUMENTS

| | | | |
|---|---|---|---|
| 3,943,549 A | | 3/1976 | Jaecklin et al. |
| 4,165,517 A | | 8/1979 | Temple et al. |
| 4,281,336 A | | 7/1981 | Sommer et al. |
| 4,323,793 A | | 4/1982 | Schutten et al. |
| 4,646,121 A | | 2/1987 | Ogura |
| 4,829,357 A | | 5/1989 | Kasahara |
| 4,864,168 A | | 9/1989 | Kasahara et al. |
| 4,956,688 A | * | 9/1990 | Honma et al. .............. 365/156 |
| 4,982,258 A | | 1/1991 | Baliga |
| 5,463,344 A | | 10/1995 | Temple |
| 6,229,161 B1 | | 5/2001 | Nemati et al. |

OTHER PUBLICATIONS

Nemati, Farid, and Plummer, James D., "A Novel High Density, Low Voltage SRAM Cell with a Vertical NDR Device", VLSI Technology Technical Digest.

Nemati, Farid, and Plummer James, D., "A Novel Thyristor–based SRAM Cell (T–RAM) for High–Speed, Low–Voltage, Giga–scale Memories", International Electron Device Meeting Techincal Digest.

Gribnikov, Z.S., Korobov, V.A., and Mitin, V.V., "The Tunnel Diode As A Thyristor Emitter", Solid–State Electronics, vol. 42, No. 9, pp. 1761–1763.

* cited by examiner

*Primary Examiner*—David Nelms
*Assistant Examiner*—Mai-Huong Tran

(57) ABSTRACT

A semiconductor device having a thyristor-based memory device exhibits improved stability under adverse operating conditions related to temperature, noise, electrical disturbances and light. In one particular example embodiment of the present invention, a semiconductor device includes a thyristor-based memory device that uses a shunt that effects a leakage current in the thyristor. The thyristor includes a capacitively-coupled control port and anode and cathode end portions. Each of the end portions has an emitter region and an adjacent base region. In one implementation, the current shunt is located between the emitter and base region of one of the end portions of the thyristor and is configured and arranged to shunt low-level current therebetween. In connection with an example embodiment, it has been discovered that shunting current in this manner improves the ability of the device to operate under adverse conditions that would, absent the shunt, result in inadvertent turn on, while keeping the standby current of the memory device to an acceptably low level.

30 Claims, 9 Drawing Sheets

FIG.4a
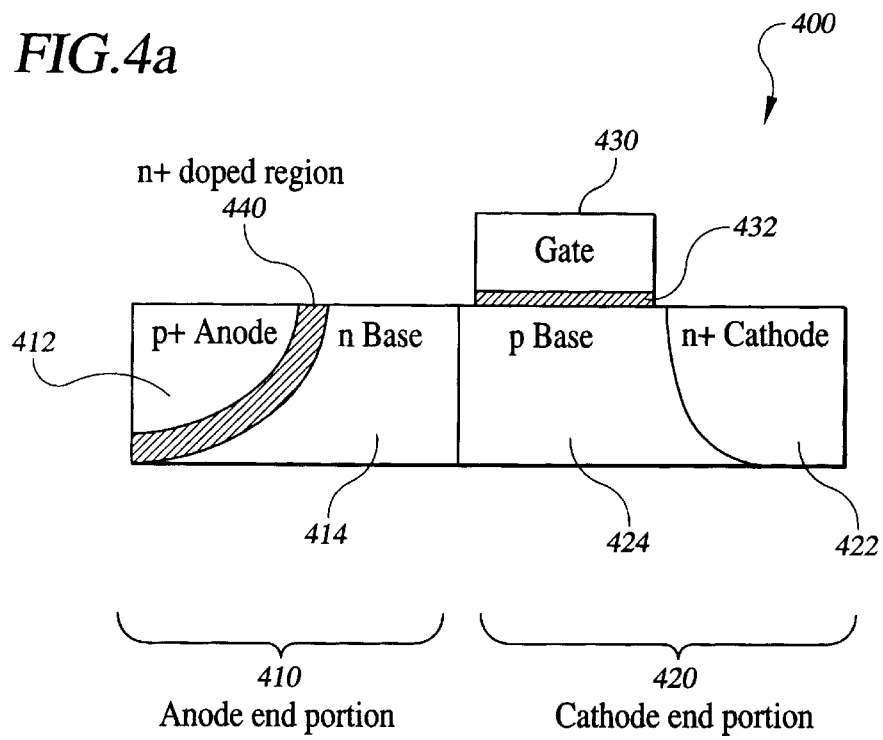
FIG.4a
FIG.4b
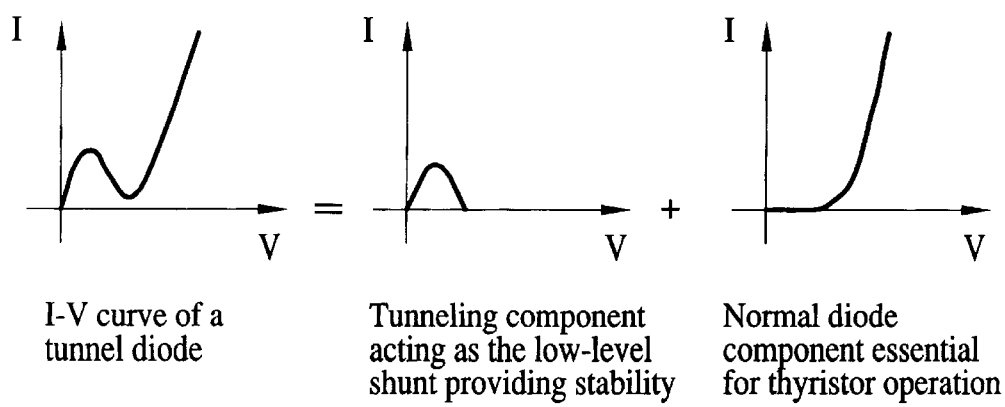
I-V curve of a tunnel diode
Tunneling component acting as the low-level shunt providing stability
Normal diode component essential for thyristor operation

STABILITY IN THYRISTOR-BASED MEMORY DEVICE

RELATED PATENT DOCUMENTS

This is a divisional of patent application Ser. No. 09/814,980, filed on Mar. 22, 2001 (TRAM.002PA), now U.S. Pat. No. 6,462,359 issued Oct. 8, 2002, to which Applicant claims priority under 35 U.S.C. §120.

FIELD OF THE INVENTION

The present invention is directed to semiconductor devices and, more specifically, to semiconductor devices including thyristor-based memory.

BACKGROUND

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages. As the use of these devices has become more prevalent, the demand for faster operation and better reliability has increased.

An important part in the circuit design, construction, and manufacture of semiconductor devices concerns semiconductor memories; the circuitry used to store digital information. Conventional random access memory devices include a variety of circuits, such as SRAM and DRAM circuits. SRAMs are mainly used in applications that require a high random access speed and/or a CMOS logic compatible process. DRAMs, on the other hand, are mainly used for high-density applications where the slow random access speed of DRAM can be tolerated.

Some SRAM cell designs are based on NDR (Negative Differential Resistance) devices. They usually consist of at least two active elements, including an NDR device. The NDR device is important to the overall performance of this type of SRAM cell. A variety of NDR devices have been introduced ranging from a simple bipolar transistor to complicated quantum-effect devices. One advantage of the NDR-based cell is the potential of having a cell area smaller than conventional SRAM cells (e.g., either 4T or 6T cells) because of the smaller number of active devices and interconnections. Many of the NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A novel type of NDR-based SRAM ("thin capacitively-coupled thyristor RAM") has been recently introduced that can potentially provide the speed of conventional SRAM at the density of DRAM in a CMOS compatible process. This new SRAM cell uses a thin capacitively-coupled NDR device and more specifically a thin capacitively-coupled thyristor to form a bistable element for the SRAM cell. For more details of specific examples of this new device, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, and "A Semiconductor Capacitively-Coupled NDR Device And Its Applications For High-Speed High-Density Memories And Power Switches," PCT Int'l Publication No. WO 99/63598, corresponding to U.S. patent application Ser. No. 09/092449, now U.S. Pat. No. 6,229,161 (Nemati, et al.). Each of these documents is incorporated by reference in its entirety.

An important design consideration in any type of thyristor-based memory cell, including a thin capacitively-coupled thyristor RAM cell, is the holding current of the thyristor. The holding current of the thyristor is the minimum current that keeps the thyristor in the forward conducting state. This holding current has to be sufficiently low so that the memory cell has an acceptable standby current. For example, a holding current larger than a few nano-Amperes per cell could significantly limit the maximum capacity of a thyristor-based memory.

Another important consideration when using a thyristor-based memory cell is the sensitivity of the blocking state of the thyristor to various adverse conditions such as noise, light, anode-to-cathode voltage changes and high temperatures. These sensitivities can affect the operation of the thyristor, resulting in undesirable turn-on, which disrupts the contents of the memory cell.

SUMMARY

The present invention is directed to a thyristor-based memory device and approach, including those specific examples discussed and incorporated above, that address the above-mentioned challenges. A particular aspect of the present invention is directed to a thyristor-based memory approach that overcomes one or more of the above-mentioned adverse conditions without significantly increasing the holding current of the thyristor and thereby preventing an unacceptable increase in standby current of the memory cell. The present invention is exemplified in a number of implementations and applications, some of which are summarized below.

According to one example embodiment, the present invention is directed to using a thyristor device having a capacitively-coupled control port to control data access (read and/or write) to a data-storage memory circuit in a semiconductor device, so that the thyristor device does not switch on inadvertently. The thyristor device's capacitively-coupled control port is used to switch the thyristor device between "on" and "off" states and thereby provide write access to the data-storage memory circuit. So that the thyristor device does not switch on inadvertently due to an adverse condition such as high temperature, noise, a very rapid anode-cathode voltage change, or light, the method includes shunting low-level current at the base region in at least one of the thyristor device's anode or cathode end portions.

According to another example embodiment, the present invention is directed to a semiconductor device that includes a thyristor-based memory. The device includes a control port capacitively coupled to a first one of either an anode or cathode end portion of the thyristor. Each of the end portions includes an emitter region and an adjacent base region, and a current shunt region is located between the emitter and base region of a second one of the end portions. A current shunt region is configured and arranged to shunt low-level current between the emitter region and the adjacent base region in a manner that improves the stability of the semiconductor device under operating conditions including high temperature, voltage, light, noise and other disturbances.

According to another example embodiment of the present invention, a current shunt that includes a tunneling current component is located near the base junction of a thyristor and is used to shunt current to the base region. The tunneling current is implemented in various forms, depending upon the particular application. In one instance, the diode includes a heavily doped region between the base and emitter regions, and in another instance includes a tunneling dielectric adjacent and between the base region and a tunnel node. In either instance, the tunneling current shunts excess current that can result from adverse operating conditions, such as those described hereinabove.

The present invention provides other advantageous implementations including, for example, specific placement of the means for shunting low-level current and various types of effective shunting devices.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 4a is a portion of another thyristor-based memory cell having a tunnel diode region between base and emitter regions of an anode end of the thyristor, according to another example embodiment of the present invention;

FIG. 4b provides three current-voltage graphs illustrating an aspect of the operation of the thyristor-based memory cell shown in FIG. 4a, also according to the present invention;

Figure 1:
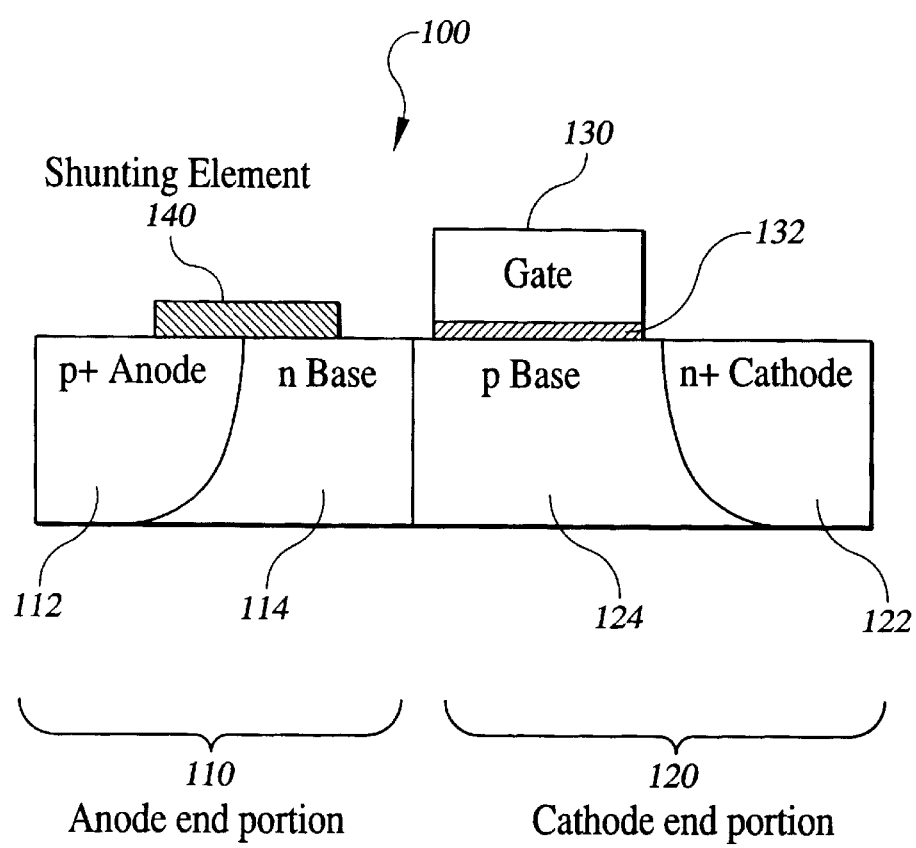
FIG. 1 is a portion of a thyristor-based memory cell having a shunting element between adjacent emitter and base regions at an anode end of the thyristor, according to one example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of thyristor-based memories, and has been found to be particularly useful for such devices benefiting from improved stability in the presence of disturbing environmental conditions such as high temperature, noise, voltage changes and light. While the present invention is not necessarily limited to such devices, various aspects of the invention may be appreciated through a discussion of various examples using this context.

According to one aspect, the present invention is directed to an approach that includes using a thyristor-based memory cell that exhibits improved stability under typical operation that includes adverse conditions, such as noise, light, voltage and temperature variations. The approach controls write access between a node external to the cell's data-storage memory circuit (or storage node) by ensuring that the thyristor device is switched between on and off states only in response to signals presented to its capacitively-coupled control port. At a base region in one or both ends of anode and cathode portions, low-level current is shunted so that the thyristor device does not switch on and inadvertently permit a write access to the cell's data-storage memory circuit.

Another aspect of the present invention provides a thyristor-based memory device that includes an array of memory cells, with each cell including a data-storage circuit and a thyristor device arranged to provide the data storage capability. The thyristor device includes anode and cathode end portions, with each end portion including an emitter region and an adjacent base region. To enhance the operation of the thyristor device and further ensure that only the thyristor's capacitively-coupled control port controls switching of the thyristor device between off and on states, a current-shunt circuit is coupled to a base region in one of the end portions. This current-shunt circuit is used for shunting low-level current and inhibiting the thyristor device from switching on inadvertently.

Other aspects and discoveries made in connection with the present invention include specific examples of low-level current shunt structures, each using different underlying mechanisms, to provide adequate stability against the above-mentioned types of environmental disturbances, while maintaining an acceptable level of holding current for the thyristor. As discussed in connection with the figures below, each of these current shunt structures enhances the ability of the semiconductor device to resist malfunctions, and in particular reduces the likelihood that the device will improperly switch from an off state to an on state in the presence of such a disturbance. The type of shunt, its construction and location can be selected according to the design considerations for each application. In many of the illustrated example embodiments, the shunt is between a base region and its adjacent emitter region. In other example embodiments, the shunt is between the n-base and another node (internal, external or common to many cells) that has a voltage higher or equal to the adjacent p+ emitter voltage, and/or between the p-base and another node that has a voltage lower or equal to the adjacent n+ emitter voltage. Combinations of these approaches can also be used.

FIG. 1 shows one such capacitively coupled thyristor 100 that can be implemented with a thyristor-based memory cell, such as a thin capacitively-coupled thyristor-RAM cell, having a low-level current shunt 140, according to a specific example embodiment of the present invention. The thyristor includes anode 110 and cathode 120 end portions, each having an emitter region 112 or 122 and a base region 114 or 124. In this implementation, the current shunt 140 is electrically connected to the emitter region 112 and base region 114 of the anode 110, and a control port 130 is capacitively coupled to the cathode via a dielectric 132. As the device is operated, the shunt 140 conducts low-level current to provide the thyristor adequate stability in a wide range of operating conditions, including high temperatures, while keeping the holding current of the thyristor at an acceptably low level, such as a few nano-Amperes, and thereby guaranteeing a low standby current. To achieve this condition for one example application, the shunt provides a high effective resistance in the range of a few mega-ohms to a few giga-ohms, and in other applications, even higher.

Various materials and processes can be used to form the shunt. For example, a high-resistivity material, such as undoped or lightly doped polysilicon or amorphous silicon, can be used. This approach is compatible with mainstream silicon CMOS technology. Alternatively, a low resistance material can be used for the shunt, which forms a low-resistance contact to one region and a high-resistance contact to another region. For example, some materials are capable of providing an Ohmic contact to a highly doped region, such as the emitter region 112, while providing a high-resistance contact to the base region 114.

Figure 2:
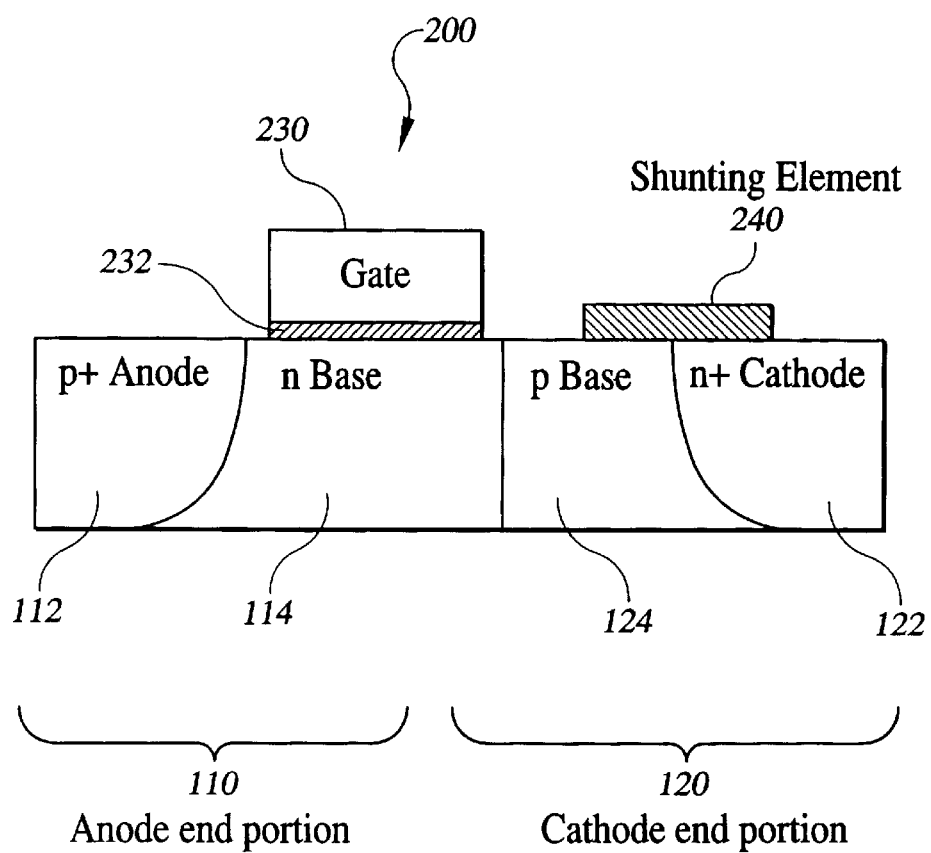
FIG. 2 is a portion of a thyristor-based memory cell having a shunting element between adjacent emitter and base regions at a cathode end of the thyristor, according to another example embodiment of the present invention.

FIG. 2 shows another specific example embodiment of the present invention. In this embodiment, a shunt 240 couples the base and emitter regions of the cathode end portion 120 of a capacitively-coupled thyristor 200. The thyristor in FIG. 2 is similar to that shown in FIG. 1, with similar portions labeled using a consistent numbering scheme. The control port 230 is located at the opposite end of the thyristor from the shunt 240 and, while the control port 230 is shown capacitively coupled to the base region 114 via a dielectric 232, it will be appreciated that the control port 230 could also overlap an adjacent region as described in the above-referenced patent document.

FIGS. 1 and 2 show thyristors having anode and cathode end portions 110 and 120 with their respective regions 112, 114, 122 and 124 lying generally in a horizontal plane. However, the shunt is applicable to a variety of thyristor devices, such as vertical and mixed vertical/horizontal thyristors. In addition, the description that follows includes example embodiments related to the remaining FIGS. 3–8, and each of these may be adaptable for such configurations. For instance, these illustrated example thyristors can be modified so that the shunt is coupled to either the anode end portion or the cathode end portion of the thyristor, and these and other related implementations are applicable to a variety of alternate thyristor body shapes.

Figure 3:
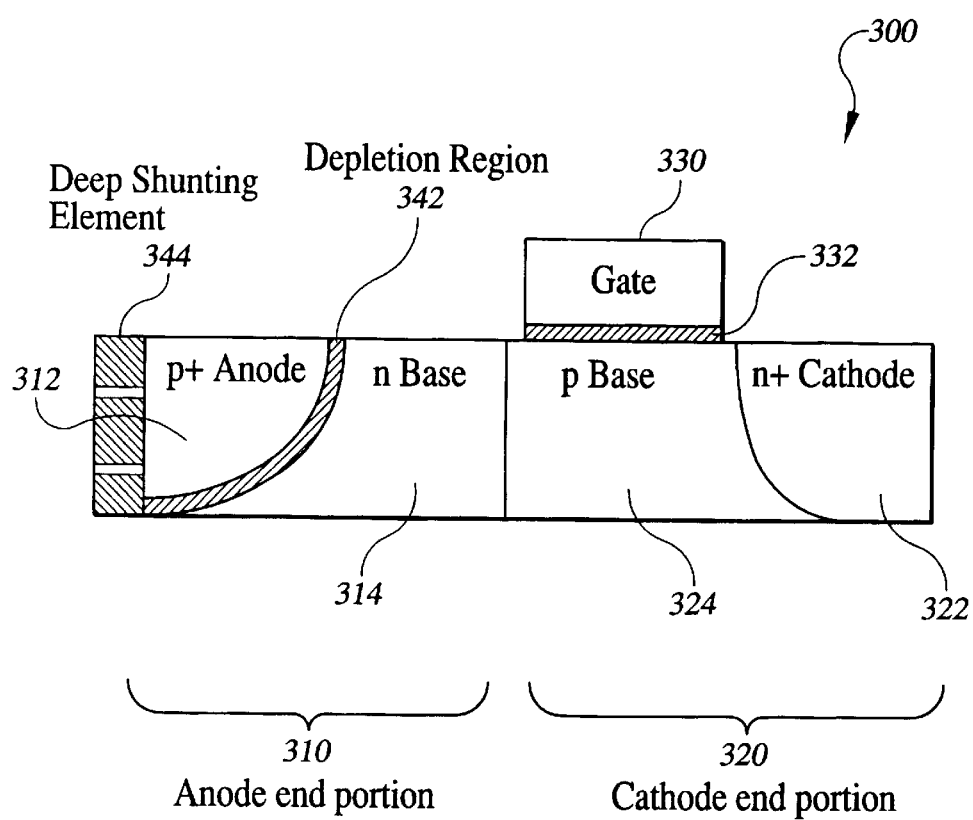
FIG. 3 is a portion of a thyristor-based memory cell having a depletion region between base and emitter regions of an anode end of the thyristor and connecting to a deep shunting element, according to another example embodiment of the present invention.

FIG. 3 shows a capacitively-coupled thyristor 300 having a shunt that connects base 314 and emitter 312 regions of an anode end portion 310 of the thyristor, according to another example embodiment of the present invention. The thyristor further includes a cathode end portion 320 having base and emitter regions 324 and 322, and a gate 330 capacitively coupled to the base region 324 via a gate dielectric 332. A shunt includes a contact region 344 and a depletion region 342 located between the base and emitter regions of the anode end portion. The contact material 344 makes direct contact to the emitter region 312 and a resistive contact to the base region 314 via the depletion region 342. The depletion region is adapted to conduct a leakage current between the base region 314 and the contact region 344. In one application, the depletion region is selected to effect a resistive connection to the base region that exhibits a comparatively higher resistance than a resistive connection to the emitter region; this can be achieved, for example, by forming a p+ emitter region which is shallower than the shunting contact by an amount less than the width of the p+ emitter to n base depletion width.

In another example embodiment of the present invention, a tunnel junction is formed between the base and emitter regions of an end portion of a capacitively coupled thyristor. FIG. 4a shows one example implementation of such a tunnel junction, wherein a heavily doped n+ tunnel junction 440 acts as a tunnel diode and is formed between an n base region 414 and a p+ emitter region 412 of an anode end portion 410 of a thyristor 400. A gate 430 is coupled via a gate dielectric 432 to the p base 424 of a cathode end portion 420 of the thyristor, which also includes n+ emitter region 422. The tunnel diode effects a leakage current that enhances thyristor stability while keeping the thyristor holding current acceptably low.

FIG. 4b shows how the total current of a tunnel junction can be viewed as having two contributing components: a tunneling current component that provides the low-level leakage current to improve stability, and a normal diode current that is used for the normal operation of the thyristor. For more information regarding the operation of a tunnel diode as a thyristor emitter, reference may be made to Z. S. Gribnikov et al., Solid-State Electronics, Vol. 42, No. 9, pp. 1761–1763, 1998.

Figure 5A:
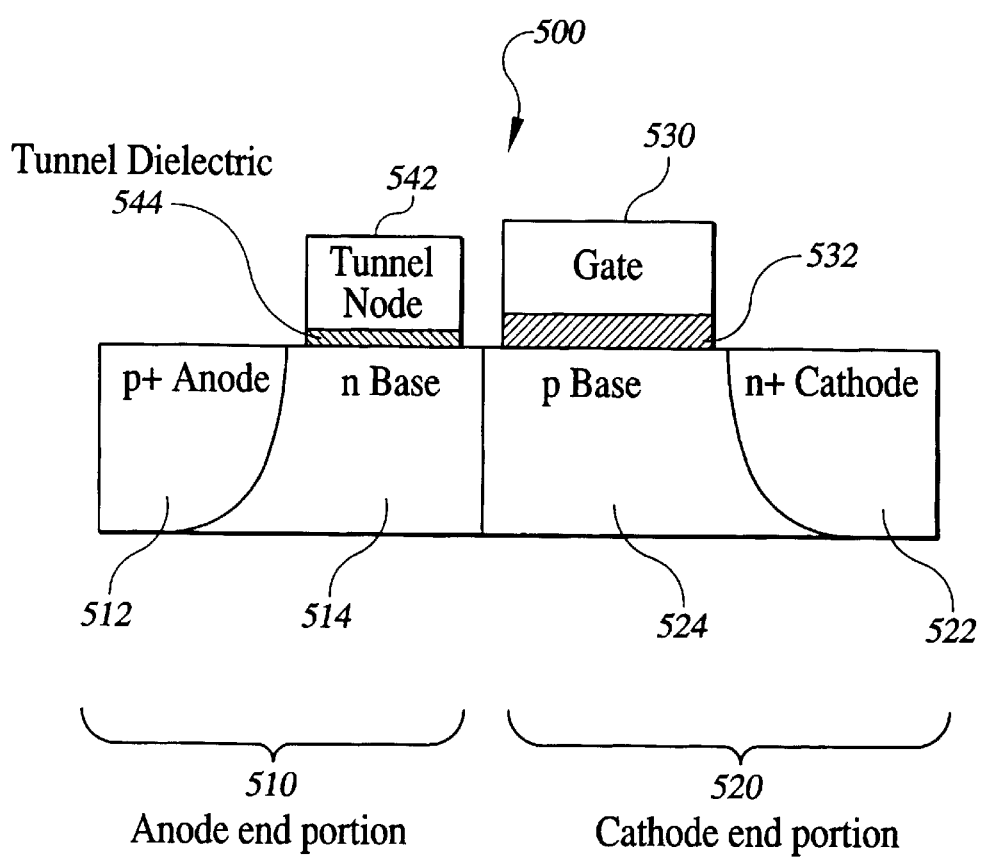
FIG. 5a is a thyristor-based memory cell having a tunnel node coupled over the anode end of the thyristor, according to another example embodiment of the present invention.

FIG. 5a shows another example embodiment of the present invention, wherein a tunnel node 542 and tunnel dielectric 544 are formed over the base 514 of an anode end portion 510 of a capacitively coupled thyristor 500. The tunnel node is resistively coupled to the base 514 via a tunneling current through the tunnel dielectric, which is sufficiently small in thickness (in one example implementation, about 30 angstroms) to permit leakage current from the base to the tunnel node. As with other examples described hereinabove, the thyristor includes gate 530 capacitively coupled to a base region 524 of a cathode end portion 520 of the thyristor, which also includes emitter region 522 and, at the anode end portion 510, an emitter region 512.

Figure 5B:
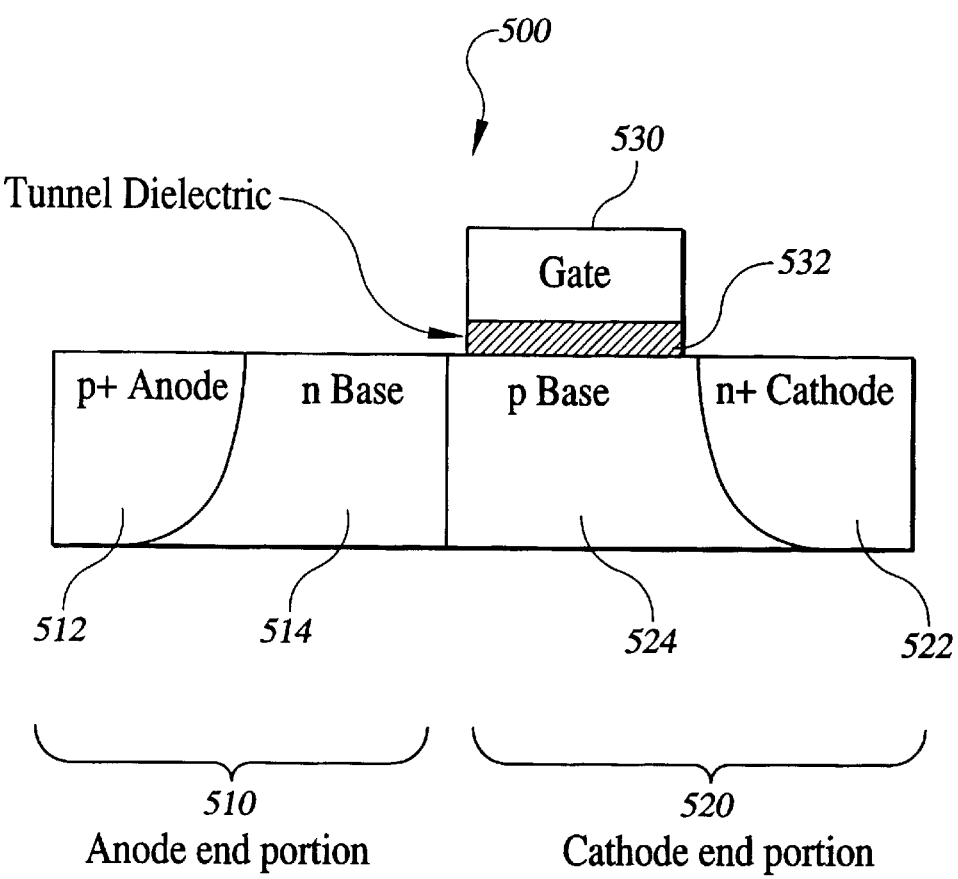
FIG. 5b is a thyristor-based memory cell having a merged node to act both as the tunnel node coupled over the cathode end of the thyristor and as the capacitively coupled control port for enhancement of write operation, according to another example embodiment of the present invention.

FIG. 5b shows an example embodiment of the present invention that relates to the example embodiment in FIG. 5a. In the embodiment of FIG. 5b, the gate 530 and dielectric 532 provide not only the capacitively coupled control port aspects, but they also provide the tunnel node and tunnel dielectric aspects as well.

Figure 6:
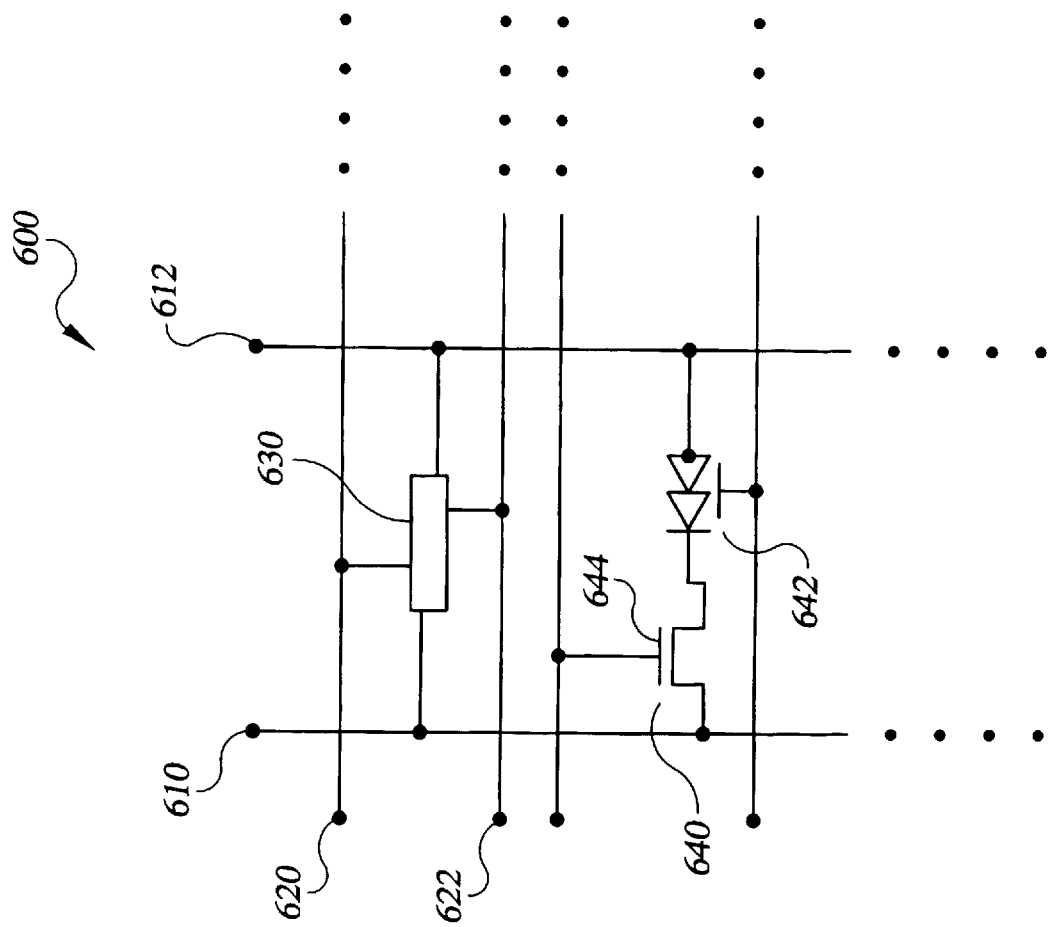
FIG. 6 is a memory array including a plurality of thyristor-based memory cells, according to another aspect and example embodiment of the present invention.

The above and other examples are applicable to a variety of semiconductor implementations and applications, including the one illustrated in FIG. 6. FIG. 6 depicts a memory cell array 600 wherein one or more of the array's cells includes a thyristor having a current shunt conducting low-level current at a base region of either an anode or a cathode end portion of the thyristor, for example, according to one of the above-discussed embodiments. The memory cell array 600 includes at least one representative memory cell 640 having such a thyristor 642 having a current shunt and coupled to a transistor 644 and to bit line 610, word lines 620, 622, 624 and 626. Another memory cell 630 may include circuitry conventionally used and/or a thyristor-based memory cell having a shunt as described herein. The array can be repeated both horizontally and vertically, as shown by the dotted lines in FIG. 6, and may be used in conjunction with other such thyristor-based memory cells.

Figure 7:
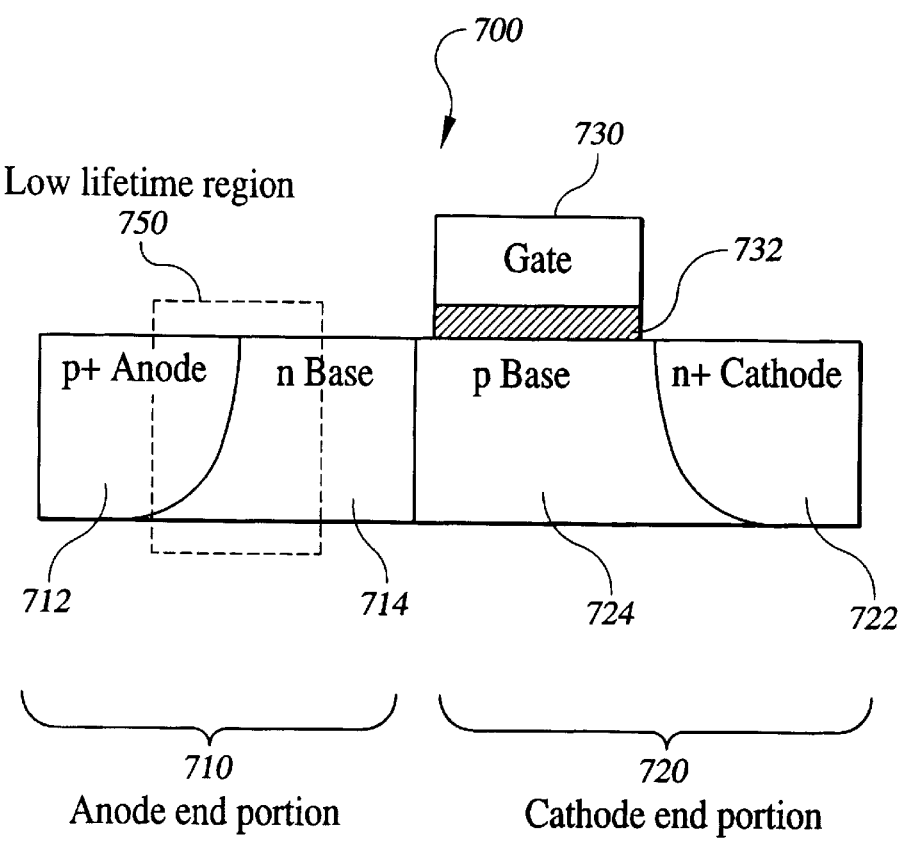
FIG. 7 is another thyristor-based memory cell having a low-lifetime region in the anode end of the thyristor, according to another aspect and example embodiment of the present invention.

FIG. 7 shows yet another example embodiment of the present invention in which a region of the thyristor at least including a base-emitter junction, such as the dotted region 750, is effected to have a low-effective minority-carrier lifetime. This minority-carrier lifetime, especially in the base-emitter depletion region, is very effective in providing a low-level shunting leakage current that provides adequate stability and acceptably low holding current for the thyristor. Lowering of the effective minority carrier lifetime in a portion of the thyristor including region 750 can be performed by a variety of different methods including, for example: using poly-crystalline, amorphous, or re-crystallized material; creating crystalline damage by particle irradiation or ion implantation; and creating additional leakage by incorporating other species that lower the lifetime for example by incorporating Germanium, Gold, Platinum, or other species that lower the minority carrier lifetime in silicon.

Figure 8:
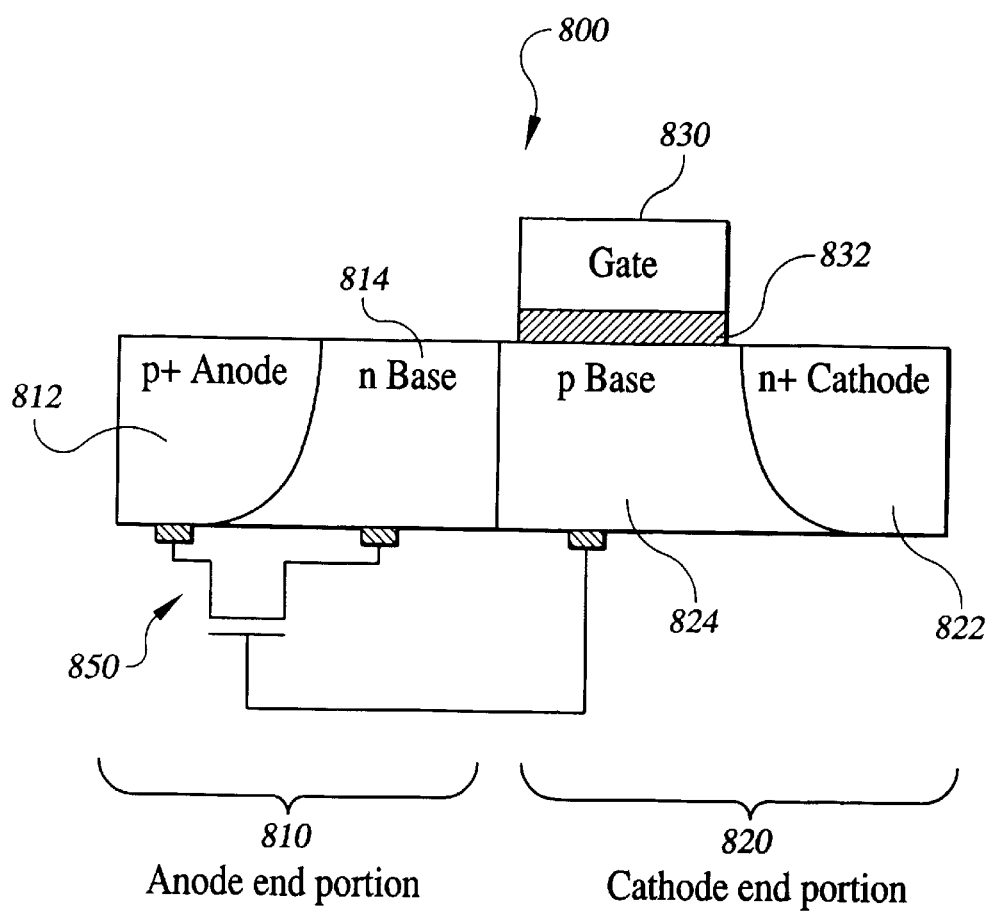
FIG. 8 is another thyristor-based memory cell having a FET arranged to shunt low-level current in the thyristor, according to another aspect and example embodiment of the present invention.

In another example embodiment of the present invention, a transistor is used as the current shunt between an emitter and base region of a thyristor. Various implementations of the transistor may be realized in connection with the example embodiments described herein. For example, FIG. 8 shows a specific implementation of such a transistor in which an NMOSFET 850 is used to provide a current shunt between anode 812 and n-base 814 of a capacitively-coupled thyristor 800. The source, drain and gate of the NMOSFET are electrically connected to the anode, n-base, and p-base of the thyristor, respectively. When the thyristor is in the forward conducting state, the voltage difference between the gate and source of the NMOSFET is relatively small (such as 0.1V to 0.2V). Therefore, the NMOSFET passes only a very small current and the holding current of the thyristor is acceptably low. When the thyristor is in the forward blocking state, the voltage difference between the gate and source of the NMOSFET is very high (almost equal to the anode to cathode voltage of the thyristor) and the NMOSFET has a small resistance. This approach provides a strong shunt between the anode and n-base of the thyristor, and provides high stability for the blocking state of the thyristor against high temperature and disturbances. Alternatively, the gate of the NMOSFET can be independently controlled rather than being connected to the p-base. Other embodiments regarding the use of a FET in combination with a thyristor can be found in U.S. Pat. No. 4,323,793, which is fully incorporated herein by reference.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor device; and interchanging P and N regions in the device structures and/or using PMOSFETS rather than NMOSFETS. Such modifications and changes do not depart from the true spirit and scope of the present invention that is set forth in the following claims.

What is claimed is:

1. A method for stabilizing data storage for a data-storage memory circuit in a semiconductor device, the memory circuit including a thyristor device having a capacitively-coupled control port and anode and cathode end portions, each end portion including an emitter region and a base region, the capacitively-coupled control port controlled to switch the thyristor device between a current passing mode and a current blocking mode, the method comprising:
shunting low-level current at a first base region of a first one of the end portions.

2. The method of claim 1, wherein said first base region is doped n-type and wherein shunting low-level current includes shunting low-level current between said first base region and another node biased at a voltage at least equal to a voltage at which the adjacent emitter region of said first end portion is biased.

3. The method of claim 1, wherein said first base region is doped p-type and wherein shunting low-level current includes shunting low-level current between said first base region and another node biased at a voltage not greater than a voltage at which the adjacent emitter region of said first end portion is biased.

4. The method of claim 1, wherein shunting low-level current includes coupling a shunt having a low resistance contract to the emitter region of said first end portion and having a comparatively higher resistance contact to the first base region.

5. The method of claim 1, wherein shunting low-level current includes inhibiting the thyristor device from inadvertently switching between current passing and current blocking modes.

6. The method of claim 1, wherein shunting low-level current includes shunting current that could otherwise cause the thyristor device to switch on inadvertently, were the current not shunted.

7. The method of claim 1, further comprising capacitively coupling the control port to a second base region at a second one of the end portions, wherein shunting current includes shunting current at the first base region.

8. The method of claim 1, wherein shunting low-level current includes shunting current between said first base region and an emitter region at the first one of the end portions.

9. The method of claim 1, wherein shunting low-level current includes shunting current between said first base region and a contact electrically coupled to an emitter region adjacent to the first base region.

10. The method of claim 1, wherein shunting low-level current includes shunting tunneling current to the base region.

11. The method of claim 1, wherein shunting current includes resistively coupling an emitter and base region of the anode end portion.

12. The method of claim 1, wherein shunting current includes resistively coupling an emitter and base region of the cathode end portion.

13. The method of claim 1, further comprising providing an intervening region between the first base region and an emitter region at the first one of the end portions.

14. The method of claim 13, further comprising doping the intervening region to a dopant concentration that is higher than the first base region.

15. The method of claim 13, wherein providing an intervening region includes providing a depletion region in the intervening region and wherein shunting current includes shunting current via the depletion region.

16. The method of claim 1, wherein the capacitively-coupled control port is adapted to change the potential across a majority of a cross-section of a base region of the thyristor.

17. A method for stabilizing data storage for a data-storage memory circuit in a semiconductor device, the data-storage memory circuit including an array of thyristors, each thyristor having a capacitively-coupled control port and anode and cathode end portions, each end portion including an emitter region and a base region, the capacitively-coupled control port being controlled to switch the thyristor between a current passing mode and a current blocking mode, the array being adapted to store data for use in conjunction with the semiconductor device, the method comprising:

shunting low-level current at a first base region of a first one of the end portions of each thyristor.

18. A method for manufacturing a semiconductor device adapted for stabilizing data storage for a data-storage memory circuit, the method comprising:

forming a thyristor device having a capacitively-coupled control port and anode and cathode end portions, each end portion including an emitter region and a base region, the capacitively-coupled control port controlled to switch the thyristor device between a current passing mode and a current blocking mode; and forming a low-level current shunt adapted to shunt current at a first base region of a first one of the end portions.

19. The method of claim 18, wherein forming a thyristor device includes doping the first base region to n-type doping and wherein forming a low-level current shunt includes forming the low-level current between the first base region and another node biased at a voltage at least equal to a voltage at which the adjacent emitter region of the first end portion is biased.

20. The method of claim 18, wherein forming a thyristor device includes doping the first base region of a first end portion of the thyristor device to p-type doping and wherein forming a low-level current shunt includes forming the low-level current shunt between the first base region and another node biased at a voltage not greater than a voltage at which the adjacent emitter region of the first end portion is biased.

21. The method of claim 18, wherein forming a low-level current shunt includes coupling a shunt having a low resistance contract to the emitter region of the first end portion of the thyristor device and having a comparatively higher resistance contact to the first base region.

22. The method of claim 18, wherein forming a thyristor device includes forming the control port capacitively coupled to a second base region at a second one of the end portions.

23. The method of claim 18, wherein forming a low-level current shunt includes forming the current shunt between the first base region and an emitter region at the first one of the end portions.

24. The method of claim 18, further comprising forming an intervening region between the first base region and an emitter region at the first one of the end portions.

25. The method of claim 24, further comprising doping the intervening region to a dopant concentration that is higher than the dopant concentration of the first base region.

26. The method of claim 24, wherein forming an intervening region includes forming a depletion region in the intervening region and wherein forming a current shunt includes forming a current shunt adapted to shunt current via the depletion region.

27. The method of claim 18, wherein forming a thyristor device includes forming a region having a low effective minority-carrier lifetime, the region at least including a base-emitter junction of the first one of the end portions of the thyristor.

28. The method of claim 27, wherein forming a region having a low effective minority-carrier lifetime includes forming a region having at least one of: poly-crystalline, amorphous, or re-crystallized material.

29. The method of claim 28, wherein forming a region having a low effective minority-carrier lifetime includes creating crystalline damage in the region.

30. The method of claim 27, wherein forming a region having a low effective carrier lifetime includes introducing impurities that lower the lifetime into the region.

* * * * *

UNITED STATES PATENT AND TRADEMARK OFFICE
CERTIFICATE OF CORRECTION

PATENT NO. : 6,653,175 B1
DATED : November 25, 2003
INVENTOR(S) : Nemati et al.

It is certified that error appears in the above-identified patent and that said Letters Patent is hereby corrected as shown below:

Title page,
Item [56], References Cited, U.S. PATENT DOCUMENTS, please include the following:
-- 5,412,228    5/1995       Baliga
   6,104,045    8/2000       Forbes et al.
   6,225,165    5/2001       Noble Jr., et al. --
OTHER PUBLICATIONS,
"Nemati, Farid, and Plummer James, D., "A Novel Thyristor" reference, "Techincal" should read -- Technical --.

Signed and Sealed this

Thirtieth Day of November, 2004

JON W. DUDAS
*Director of the United States Patent and Trademark Office*